US007065730B2

(12) United States Patent
Alpert et al.

(10) Patent No.: US 7,065,730 B2
(45) Date of Patent: *Jun. 20, 2006

(54) POROSITY AWARE BUFFERED STEINER TREE CONSTRUCTION

(75) Inventors: Charles Jay Alpert, Round Rock, TX (US); Rama Gopal Gandham, Wappinhgers Falls, NY (US); Jiang Hu, College Station, TX (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 283 days.

This patent is subject to a terminal disclaimer.

(21) Appl. No.: 10/418,469

(22) Filed: Apr. 17, 2003

(65) Prior Publication Data

US 2004/0216072 A1    Oct. 28, 2004

(51) Int. Cl.
*G06F 17/50* (2006.01)
(52) U.S. Cl. .............................. 716/13; 716/11; 716/12; 716/14
(58) Field of Classification Search .................... 716/2, 716/5, 8–14; 703/14
See application file for complete search history.

(56) References Cited

U.S. PATENT DOCUMENTS 6,401,234 B1*   6/2002  Alpert et al. ................. 716/13
6,442,745 B1*   8/2002  Arunachalam et al. ....... 716/13
6,519,745 B1*   2/2003  Srinivas et al. ................ 716/5
6,557,145 B1*   4/2003  Boyle et al. ................... 716/2
2003/0188286 A1* 10/2003  Teig et al. .................... 716/13
2004/0123261 A1*  6/2004  Alpert et al. ................. 716/13

OTHER PUBLICATIONS

Hrkic et al., "Buffer Tree Synthesis with Consideration of Temporal Locality, Sink Polariy Requirements, Solution Cost, Congestion, and Blockages," IEEE, Apr. 23, 2003, pp. 481-491.*
Alpert et al., "Porisity-Aware Buffered Steiner Tree Construction," Apr. 2004, pp. 517-526.*
Alpert et al., "Buffer Insertion with Adaptive Blockage Avoidance," IEEE, Apr. 2, 2003, pp. 492-498.*
Sze et al., "A Place and Route Aware Buffered Steiner Tree Construction," IEEE, 2004, pp. 355-498.*
Zhou et al, "Simultaneous Routing and Buffer Insertion with Restrictions on Buffer Location", IEEE Transaction on Computer Aided Design of Integrated Circuits and Systems, vol. 19, No. 7, Jul. 2000, pp. 819-824.

(Continued)

*Primary Examiner*—Vuthe Siek
(74) *Attorney, Agent, or Firm*—Duke W. Yee; Casimer K. Salys; Cathrine K. Kinslow

(57) ABSTRACT

A method, computer program product, and data processing system for porosity-aware buffered Steiner tree construction are disclosed. A preferred embodiment begins with a timing-driven Steiner tree generated without regard for porosity, then applies a plate-based adjustment guided by length-based buffer insertion. After performing localized blockage avoidance, the resulting tree is then passed to a buffer placement algorithm, such as van Ginneken's algorithm, to obtain a porosity-aware buffered Steiner tree.

8 Claims, 7 Drawing Sheets

OTHER PUBLICATIONS van Ginneken, "Buffer Placement in Distributed RC-tree Networks for Minimal Elmore Delay", International Business Machines Corporation, Abstract, pp. 865-868.

Gupta et al, "The Elmore Delay as a Bound for RC Trees with Generalized Input Signals", IEEE Transactions on Computer-Aided Design of Integrated Circuits and Systems, vol. 16, No. 1, Jan. 1997, pp. 95-104.

Alpert et al., "Buffer Insertion with Accurate Gate and Interconnect Delay Computation", International Business Machines Corporation, Abstract, pp. 479-484.

Alpert et al., "Wire Segmenting for Improved Buffer Insertion", IBM Austin Research Laboratory, Austin, Texas, Abstract, pp. 588-593.

Alpert et al., "Steiner Tree Optimization for Buffers, Blockages, and Bays", IEEE Transactions on Computer-Aided Design of Integrated Circuits and Systems, vol. 20, No. 4, Apr. 2001, pp. 556-562.

Cong et al., "Buffer Block Planning for Interconnect-Driven Floorplanning", Department of Computer Science, University of California, Los Angeles, CA, Abstract, pp. 358-363.

Alpert et al., "Buffer Insertion for Noise and Delay Optimization", International Business Machines Corporation, Abstract, pp. 362-367.

Cong et al., "Routing Tree Construction Under Fixed Buffer Locations", ACM Digital Library, 2000, pp. 379-384.

Tang et al., "A New Algorithm for Routing Tree Construction with Buffer Insertion and Wire Sizing Under Obstacle Constraints", University of Texas at Austin, Austin, TX, IEEE, 2001, pp. 49-56.

Lai et al., "Maze Routing with Buffer Insertion and Wiresizing", ACM Digital Library, 2000, pp. 374-378.

Jagannathan et al., "A Fast Algorithm for Context-Aware Buffer Insertion", ACM Digital Library, 2000, pp. 368-373.

Lillis et al., "Simultaneous Routing and Buffer Insertion for High Performance Interconnect", University of California, San Diego, La Jolla, CA, IEEE 1996, pp. 148-153.

Alpert et al., "Buffered Steiner Trees for Difficult Instances", IEEE Transactions on Computer-Aided Design of Integrated Circuits and Systems, vol. 21, No. 1, Jan. 2002, pp. 3-13.

Cormen et al., "Interval Trees", Introduction to Algorithms, MIT Press, 2001, pp. 311-316.

Hrkic et al., "Buffer Tree Synthesis with Consideration of Temporal Locality, Sink Polarity Requirements, Solution Cost and Blockages", University of Illinois at Chicago, CS Dept., Chicago, IL 60607, ISPD 2002, pp. 98-103.

Hu et al., "Buffer Insertion with Adaptive Blockage Avoidance", ISPD 2002, San Diego, CA, USA, pp. 92-97.

Hrkic et al., "S-Tree: A Technique for Buffered Routing Tree Synthesis", University of Illinois at Chicago, Cs Dept., Chicago, IL 60607, DAC 2002, pp. 578-583.

Donath et al., "Transformational Placement and Synthesis", International Business Machines Corporation, Abstract, pp. 1-8.

Alpert et al., "A Practical Methodology for Early Buffer and Wire Resource Allocation", International Business Machines Corporation, Abstract, pp. 189-194.

Alpert et al., "Steiner Tree Optimization for Buffers, Blockages, and Bays", IEEE Transactions on Computer-Aided Design of Integrated Circuits and Systems, vol. 20, No. 4, Apr. 2001, pp. 556-562.

U.S. Appl. No. 10/324,732, Alpert et al., Buffer Insertion with Adaptive Blockage Avoidance, filed Dec. 18, 2002.

U.S. Appl. No. 10/264,165, Alpert et al., Optimal Buffered Routing Path Constructions for Single and Multiple Clock Domain Systems, filed Oct. 3, 2002.

Alpert et al., "Porosity Aware Buffered Steiner Tree Construction", ISPD'03 Monterey California 2003, ACM Digital Library 2003, pp. 1-8.

* cited by examiner

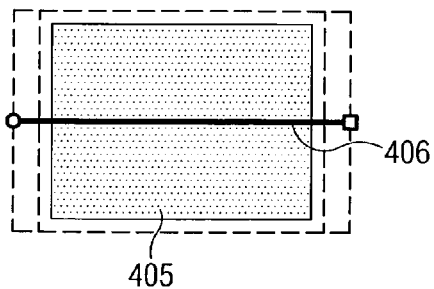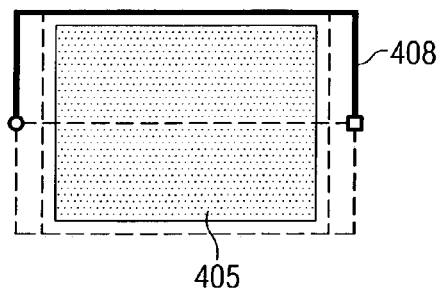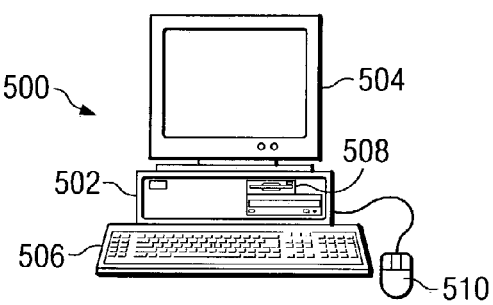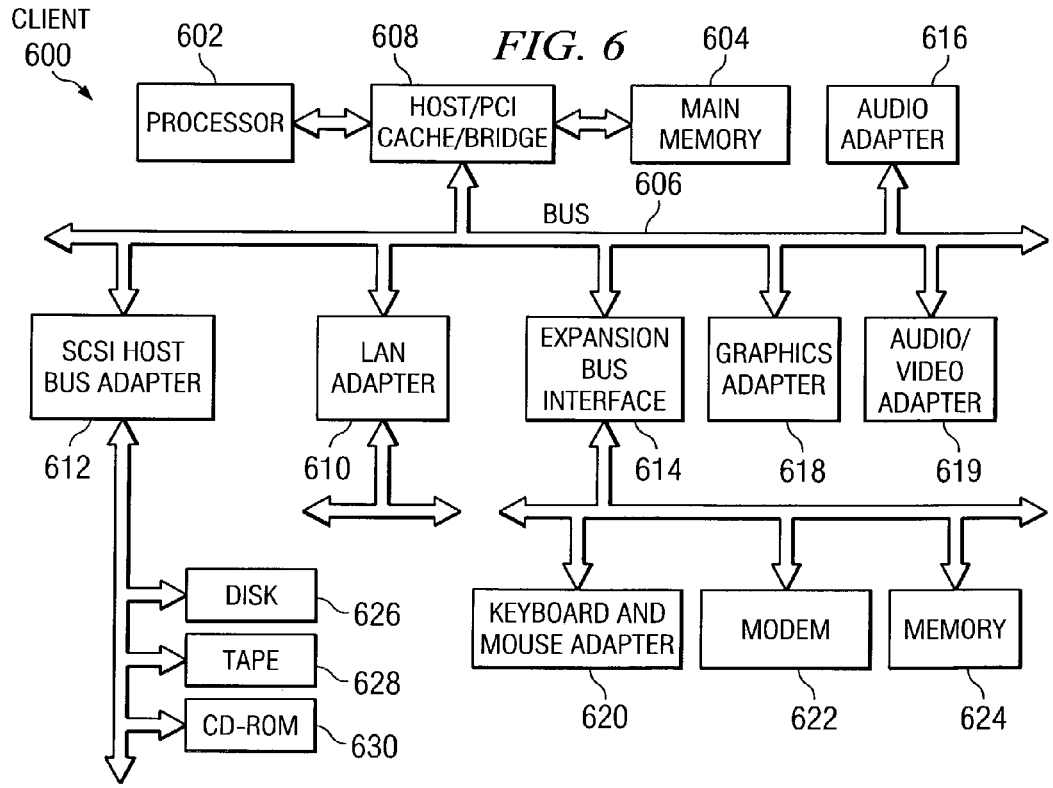

POROSITY AWARE BUFFERED STEINER TREE CONSTRUCTION

CROSS REFERENCE TO RELATED APPLICATIONS

The present application is related to a commonly assigned, U.S. patent application entitled "BUFFER INSERTION WITH ADAPTIVE BLOCKAGE AVOIDANCE," Ser. No. 10/324,732, filed Dec. 18, 2002, which is hereby incorporated by reference now U.S. Pat. No. 6,898,774. The present invention is related to another commonly assigned, U.S. patent application entitled "OPTIMAL BUFFERED ROUTING PATH CONSTRUCTIONS FOR SINGLE AND MULTIPLE CLOCK DOMAIN SYSTEMS," Ser. No. 10/264,165, filed Oct. 3, 2002, which is hereby also incorporated by reference now U.S. Pat. No. 6,915,361.

BACKGROUND OF THE INVENTION

1. Technical Field

The present invention relates generally to the automated layout of integrated circuits. In particular, the present invention is directed toward automatic generation of optimized wire routing in very large scale integration (VLSI) circuits.

2. Description of Related Art

In recent years, it has become commonplace for integrated circuit designers to build an integrated circuit layout from libraries of reusable high-level modules, sometimes referred to as "macro blocks." Proprietary macro blocks are often referred to as "intellectual property blocks" ("IP blocks"), to emphasize their relatively intangible, yet proprietary nature. Computerized integrated circuit design tools may be used to store, retrieve, and combine macro blocks into complete integrated circuits. This design philosophy of combining reusable macro blocks to produce a complex integrated circuit is known as "system-on-a-chip" (SoC) design. Designing a "system-on-a-chip" involves designing the interconnections between macro blocks. Despite the apparent simplicity of SoC design, this is often not a trivial task. The reason for this is that the connections themselves are physical components (i.e., wires) with non-ideal properties. Like all electrical conductors, integrated circuit connections suffer from delay and signal loss due to physical properties such as resistance, capacitance, and relativistic limitations on the speed at which electrons are able to travel. In order to ensure that all components in an integrated circuit are properly synchronized to work properly, it is important to take these factors into account when designing interconnections between macro blocks to minimize signal loss and to allow operation within acceptable timing specifications.

Buffer insertion is now widely recognized as a key technology for improving VLSI (Very Large Scale Integration) interconnect performance. For a buffer insertion technique to be effective, however, it must be fully aware of its surrounding blockage constraints while also being efficient enough to quickly process thousands of nets. In the buffer insertion literature, van Ginneken's dynamic programming based algorithm has established itself as a classic in the field. Van Ginneken's algorithm is described in L. P. P. van Ginneken, "Buffer placement in distributed RC-tree networks for minimal Elmore delay," *Proceedings of the IEEE International Symposium on Circuits and Systems*, pp. 865–868, 1990, which is hereby incorporated by reference. Van Ginneken's algorithm assumes a Steiner tree routing topology and inserts buffers into the Steiner tree so as to minimize Elmore delay. The Elmore delay metric is described in R. Gupta, B. Tutuianu, and L. T. Pileggi, "The Elmore Delay as a Bound for RC Tree with Generalized Input Signals," *IEEE Transactions on Computer Aided Design of Integrated Circuits and Systems*, vol. 16, no. 1, pp. 95–104 (January 1997), which is hereby incorporated by reference.

A Steiner tree is defined as follows: If, in a weighted graph, a subset of the vertices are designated as "terminals," a Steiner tree is a minimum-weight connected subgraph which includes all of the "terminals." Thus, for example, a minimum spanning tree of a graph is a special case of a Steiner tree in which all of the vertices in the graph are selected as terminals. A Steiner node is an interior node (i.e., not a root or leaf node) in a Steiner tree.

In J. Lillis, C. K. Cheng, and T. Y. Lin. "Optimal wire sizing and buffer insertion for low and a generalized delay model," *IEEE Journal of Solid-State Circuits*, 31(3): 437–447, March 1996, Lillis et al. extended van Ginneken's algorithm by using a buffer library with inverting and non-inverting buffers, while also considering power consumptions.

One weakness of the van Ginneken approach is that it requires a fixed Steiner tree topology has to be provided in advance, which makes the final buffer solution quality dependent on the input Steiner tree. Even though it is optimal for a given topology, the van Ginneken algorithm will yield poor solutions when fed a poor topology. To overcome this problem, several works have proposed simultaneously constructing a Steiner tree while performing buffer insertion. J. Lillis, C. K. Cheng, and T. Y. Lin, "Simultaneous routing and buffer insertion for high performance interconnect," *Proceedings of the Great Lake Symposium on VLSI*, pages 148–153, 1996. describes the "buffered P-Tree" algorithm, which integrates buffer insertion into the P-Tree Steiner tree algorithm.

Buffered P-Tree generally yields high quality solution, but its time complexity is also high because candidate solutions are explored on almost every node in the Hanan grid. In the recently reported S-Tree algorithm, alternative abstract topologies for a given Steiner tree are explored to promote solutions that are better at dealing with sink criticalities. S-Tree is described in M. Hrkic and J. Lillis, "S-tree: A technique for buffered routing tree synthesis," *Proceedings of the ACM/IEEE Design Automation Conference*, pages 578–583, 2002. The S-Tree technique is integrated with P-Tree as SP-Tree algorithm in M. Hrkic and J. Lillis, "Buffer tree synthesis with consideration of temporal locality, sink polarity requirements, solution cost and blockages." *Proceedings of the ACM International Symposium on Physical Design*, pages 98–103, 2002.

A different approach to remedying this weakness of van Ginneken's algorithm is described in C. J. Alpert, G. Gandham, M. Hrkic, J. Hu, A. B. Kahng, J. Lillis, B. Liu, S. T. Quay, S. S. Sapatnekar, and A. J. Sullivan, "Buffered Steiner trees for difficult instances," *IEEE Transactions on Computer-Aided Design*, 21(1): 3–14, January 2002, which is hereby incorporated by reference. Alpert et al. construct a "buffer-aware" Steiner tree, using an algorithm called C-Tree, for van Ginneken's algorithm. Despite being a two-stage sequential method, C-Tree yields solutions comparable in quality to simultaneous methods, while consuming significantly less CPU time.

Recent trends toward hierarchical (or semi-hierarchical) chip design and system-on-chip design force certain regions of a chip to be occupied by large building blocks or IP cores so that buffer insertion is not permitted. These constraints on buffer locations can severely hamper solution quality, and these effects need be considered. Thus buffer blockages are considered in the "buffered path" class of algorithms. Several such algorithms are described in H. Zhou, D. F. Wong, I-M. Liu, and A. Aziz. "Simultaneous routing and buffer insertion with restrictions on buffer locations," *Proceedings of the ACM/IEEE Design Automation Conference*, pages 96–99, 1999; A. Jagannathan, S.-W. Hur, and J. Lillis, "A fast algorithm for context-aware buffer insertion," *Proceedings of the ACM/IEEE Design Automation Conference*, pages 368–373, 2000; and M. Lai and D. F. Wong, "Maze routing with buffer insertion and wiresizing," *Proceedings of the ACM/IEEE Design Automation Conference*, pages 374–378, 2000. Though optimal, the buffered path algorithms are only applicable to two-pin nets. Works that handle restrictions on buffer locations while performing simultaneous Steiner tree construction and buffer insertion are proposed in J. Cong and X. Yuan, "Routing tree construction under fixed buffer locations," *Proceedings of the ACM/IEEE Design Automation Conference*, pages 379–384, 2000 and X. Tang, R. Tian, H. Xiang, and D. F. Wong, "A new algorithm for routing tree construction with buffer insertion and wire sizing under obstacle constraints," *Proceedings of the IEEE/ACM International Conference on Computer-Aided Design*, pages 49–56, 2001. Like buffered P-Tree, these approaches can provide high quality solutions, though at runtimes that can be too high for practical use in a physical synthesis system.

In C. J. Alpert, G. Gandham, J. Hu, J. L. Neves, S. T. Quay, and S. S. Sapatnekar, "A Steiner tree construction for buffers, blockages, and bays," *IEEE Transactions on Computer-Aided Design*, 20(4): 556–562, April 2001, which is hereby incorporated by reference, a Steiner tree is rerouted to avoid buffer blockages before conducting buffer insertion. This sequential approach is fast, but sometimes results in poor solutions, due to unnecessary wiring detours. An adaptive tree adjustment technique for obtaining a good solution more efficiently is provided in a commonly assigned, co-pending U.S. patent application entitled "BUFFER INSERTION WITH ADAPTIVE BLOCKAGE AVOIDANCE," Ser. No. 10/324,732, filed Dec. 18, 2002, which is hereby incorporated by reference.

The Importance of Porosity

In tradition design processes, buffer insertion is applied after block placement to optimize interconnect timing. As interconnect effects become increasingly severe, however, buffer insertion needs to be addressed earlier in the design process to help logic optimization and placement algorithms with interconnect estimation and to reserve buffering resources. The sheer number of nets that may require buffering suggests that resources need to be allocated intelligently. For example, large blocks placed close together create narrow alleys that become likely locations for a buffer placement algorithm to insert buffers, since such alleys are the only locations in which buffers can be inserted for routes that cross over these blocks.

Competition for resources for these routes can be very fierce, though. Inserting buffers for less critical nets can eliminate space needed for more critical nets that may require gate sizing or other logic transforms. Further, though no blockages lie in the alleys, the alleys could already be packed with logic and no feasible space for a buffer might exist. If a buffer insertion algorithm cannot recognize this scenario, then inserting a buffer into such a space will cause a non-realizable solution. To make the solution legal, the buffer or may be forced to move to an awkward, sub-optimal position that fails to meet timing requirements. Hence, whenever possible a buffer insertion algorithm should avoid more densely populated regions unless absolutely critical.

In this document, an algorithm that avoids inserting buffers into dense regions is referred to as being "porosity-aware." "Porosity," for the purposes of this document, refers to the degree to which a given region is not dense. Thus, "porosity" may be thought of as the opposite of "density." A number of different measures for porosity may be defined and used within the context of an embodiment of the present invention.

For example, FIG. 1A shows a 2-pin net 100 which is routed through a dense region or "hot spot" 102, and FIG. 1B shows net 100 routed differently to avoid dense region 102. Both solutions have the same wirelength and timing characteristics. FIGS. 1C and 1D show another example for a multi-pin net 106 where a Steiner point 108 needs to be moved outside of a dense region 110 to yield an improved buffer insertion result.

The literature contains no buffering approach that addresses these issues. Note that several algorithms (such as S-Tree and SP-Tree) could be used to address porosity constraints, since they can be run on arbitrary grid graphs. However, the extensions to such algorithms that are necessary to make such algorithms porosity-aware are hardly straightforward. One has to carefully consider factors such as (but not limited to) the weighting scheme for edges in the grid graph, how to sparsify the graph to give reasonable runtimes, the appropriate cost functions, and the like. Further, any simultaneous approach is likely to require too much runtime to be of practical use for physical synthesis. Thus, a need exists for an efficient and porosity-aware approach to constructing buffered Steiner trees that is straightforward to implement.

SUMMARY OF THE INVENTION

The present invention provides a method, computer program product, and data processing system for porosity-aware buffered Steiner tree construction. A preferred embodiment begins with a timing-driven Steiner tree generated without regard for porosity, then applies a plate-based adjustment guided by length-based buffer insertion. After performing localized blockage avoidance, the resulting tree is then passed to a buffer placement algorithm, such as van Ginneken's algorithm, to obtain a porosity-aware buffered Steiner tree.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 4A–4D are diagrams that depict various degrees of local buffer blockage avoidance in accordance with a preferred embodiment of the present invention;

FIG. 5 is a diagram of a data processing system in which a preferred embodiment of the present invention may be implemented; and FIG. 6 is a block diagram of a data processing system in which a preferred embodiment of the present invention may be implemented.

DETAILED DESCRIPTION OF THE PREFERRED EMBODIMENT

Preliminaries

Figure 1A:
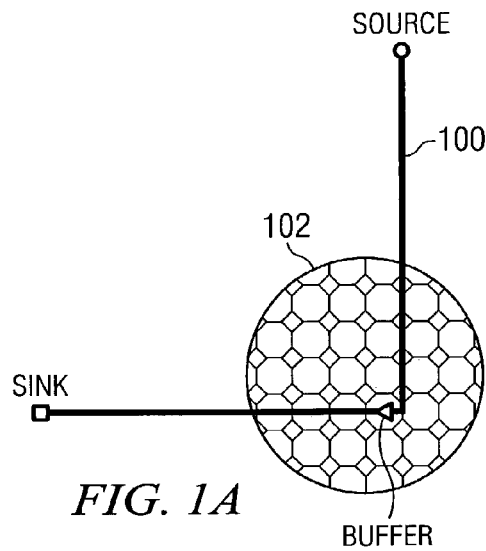
FIGS. 1A–1D are diagrams that depict adjustments to a buffered Steiner tree topology to avoid dense areas.
Figure 1B:
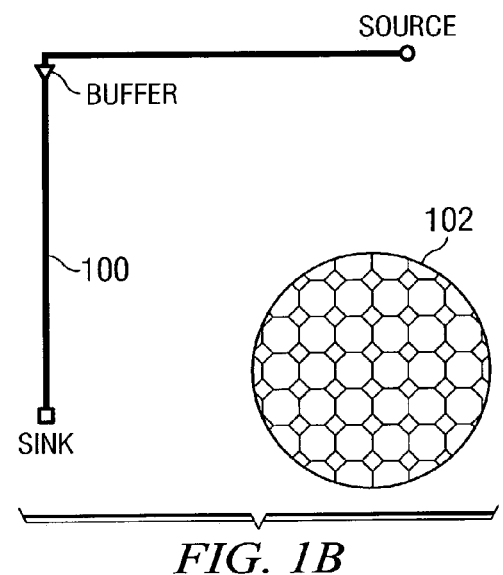
Figure 1C:
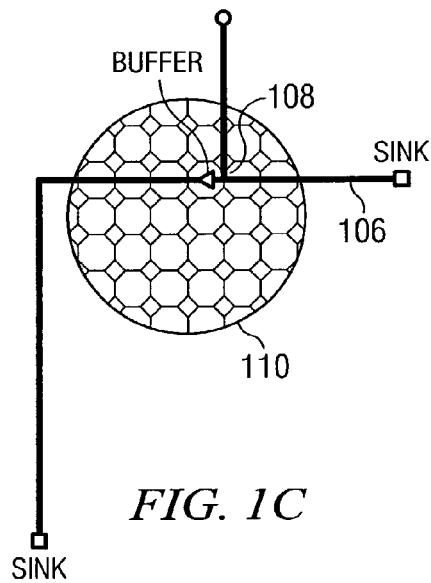
Figure 1D:
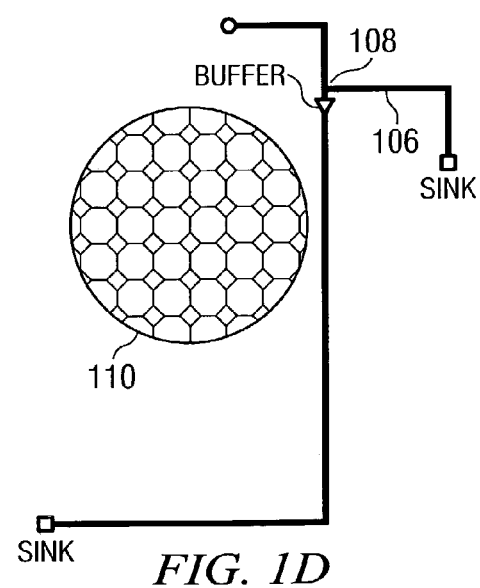

Porosity is represented through a tile graph $G(V_G, E_G)$ where a node $g \epsilon V_G$ corresponds to a tile and an edge $e_{uv} \epsilon E_G$ represents a boundary between two neighboring tiles u, $v \epsilon V_G$. A tile graph is a graph in which the edges in the graph divide the surface into tiles. If a tile $g \epsilon V_G$ has an area of $A(g)$ and the area of g that is occupied by placed cells is $a(g)$, the placement density is defined as the area usage density $$d(g) = \frac{a(g)}{A(g)}$$

of tile g.

The present invention addresses the following formally-stated problem of integrated circuit design:

Porosity-aware Buffered Steiner Tree Problem: Given a net $N = \{v_0, v_1, \ldots v_n\}$ with source $v_0$ and sinks $\{v_1, \ldots, v_n\}$, load capacitance $c(v_i)$ and required arrival time $q(v_i)$ for $1 \leq i \leq n$, tile graph $G(V_G, E_G)$, and a buffer type b, construct a Steiner tree $T(V, E)$, in which $V = N \cup V_{Steiner}$ (where $V_{Steiner}$ is the set of Steiner nodes in the resulting Steiner tree) and edges in E span every node in V, such that a buffer insertion solution that satisfies $q(v_i)$ may be obtained with a minimal porosity cost.

To calculate porosity cost, a preferred embodiment of the present invention sums the costs of the tiles that the routes cross. A preferred embodiment of the present invention uses the following function for calculated the cost of a single tile, though certainly others can be used as well, depending on the application: For each buffer inserted in a tile g, the cost is the square of the density $d(g)$ (i.e., the cost is $[d(g)]^2$. Thus, the more buffers that are inserted, the higher the cost, though buffers are relatively cost-free in sparser regions.

It should be noted that this preferred cost function does not impose an infinite penalty (i.e., an infinite cost for a tile) if inserting a buffer exceeds the density target. While imposing an infinite penalty in such situations could be employed to strictly enforce density constraints, it may be better to insert a buffer into an overly dense region and move other cells out of the region than to accept a significantly inferior delay result. One of ordinary skill in the art will recognize that ultimately the right trade-off between porosity cost and timing depends on the criticality of the net and the desired design characteristics.

Algorithm Description

Overview

Since simultaneous Steiner tree construction and buffer insertion can be computationally expensive for practical circuit designs, a preferred embodiment of the present invention first constructs a Steiner tree, then applies a van Ginneken-style buffer insertion algorithm that employs higher order delay models, handles slew and load capacitance constraints, manages a library of inverting and non-inverting buffers, and balances buffer resource utilization with solution quality. Alternatively, integrating a Steiner tree construction into the buffer-insertion algorithm while maintaining is possible, but the high computation time required may not be practical for a particular application. As another alternative, a Steiner tree may be constructed without performing buffer insertions, but this alternative approach may not yield an optimal topology. Thus, a preferred embodiment of the present invention solves the above-described porosity-aware buffered Steiner tree problem through the following four stages:

1. Initial porosity ignorant timing-driven Steiner tree construction
2. Plate-based adjustment for porosity improvement
3. Local blockage avoidance
4. Van Ginneken-style buffer insertion For Stage 1, a timing-driven Steiner tree is constructed. This may be accomplished using any one of a number of heuristics known in the art. A preferred embodiment of the present invention utilizes the "buffer aware" C-Tree algorithm described in the aforementioned incorporated reference C. J. Alpert, G. Gandham, M. Hrkic, J. Hu, A. B. Kahng, J. Lillis, B. Liu, S. T. Quay, S. S. Sapatnekar, and A. J. Sullivan, "Buffered Steiner trees for difficult instances," *IEEE Transactions on Computer-Aided Design*, 21(1): 3–14, January 2002.

The plate-based adjustment phase (stage two) modifies the existing timing-driven Steiner tree in an effort to reduce congestion cost, while maintaining the tree's high performance. One of the key elements is that it allows Steiner points to migrate outside of high-porosity tiles into lower-porosity tiles to reduce congestion while maintaining (if not improving) performance.

After Stage 2, the Steiner tree is correct inasmuch as is passes through tiles that optimize performance while minimizing porosity cost, though the routes may overlap blockages. Performing local blockage avoidance in Stage 3 manipulates the routes within each tile to avoid blockages, thereby allowing more buffer insertion candidates. However, Stage 3 does not disturb the tree topology computed in Stage 2. An example of local blockage avoidance in accordance with a preferred embodiment of the present invention is illustrated in FIGS. 2A and 2B.

Figure 2A:
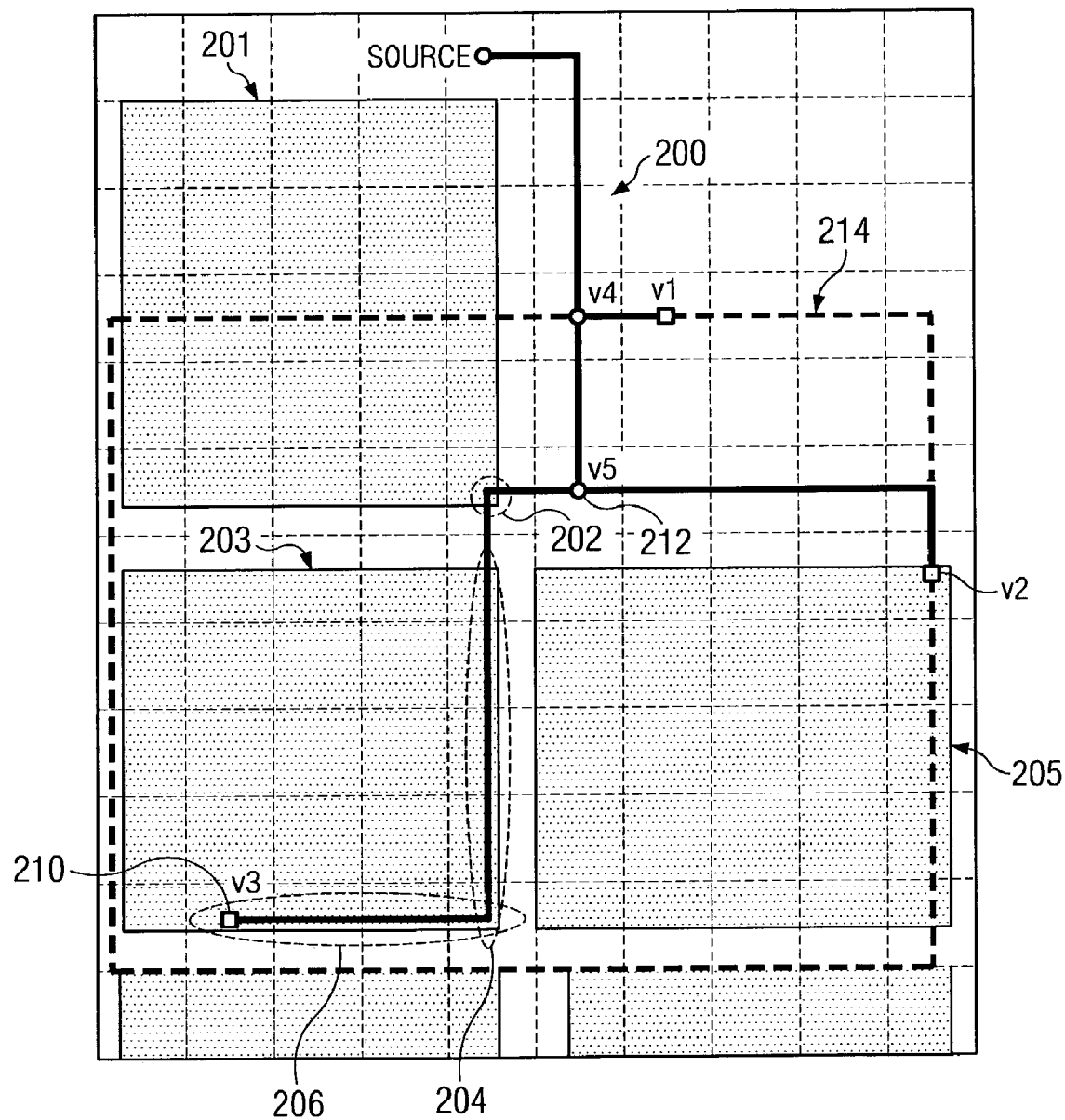
FIGS. 2A–2B are diagrams that depict local buffer blockage avoidance in accordance with a preferred embodiment of the present invention.
Figure 2B:
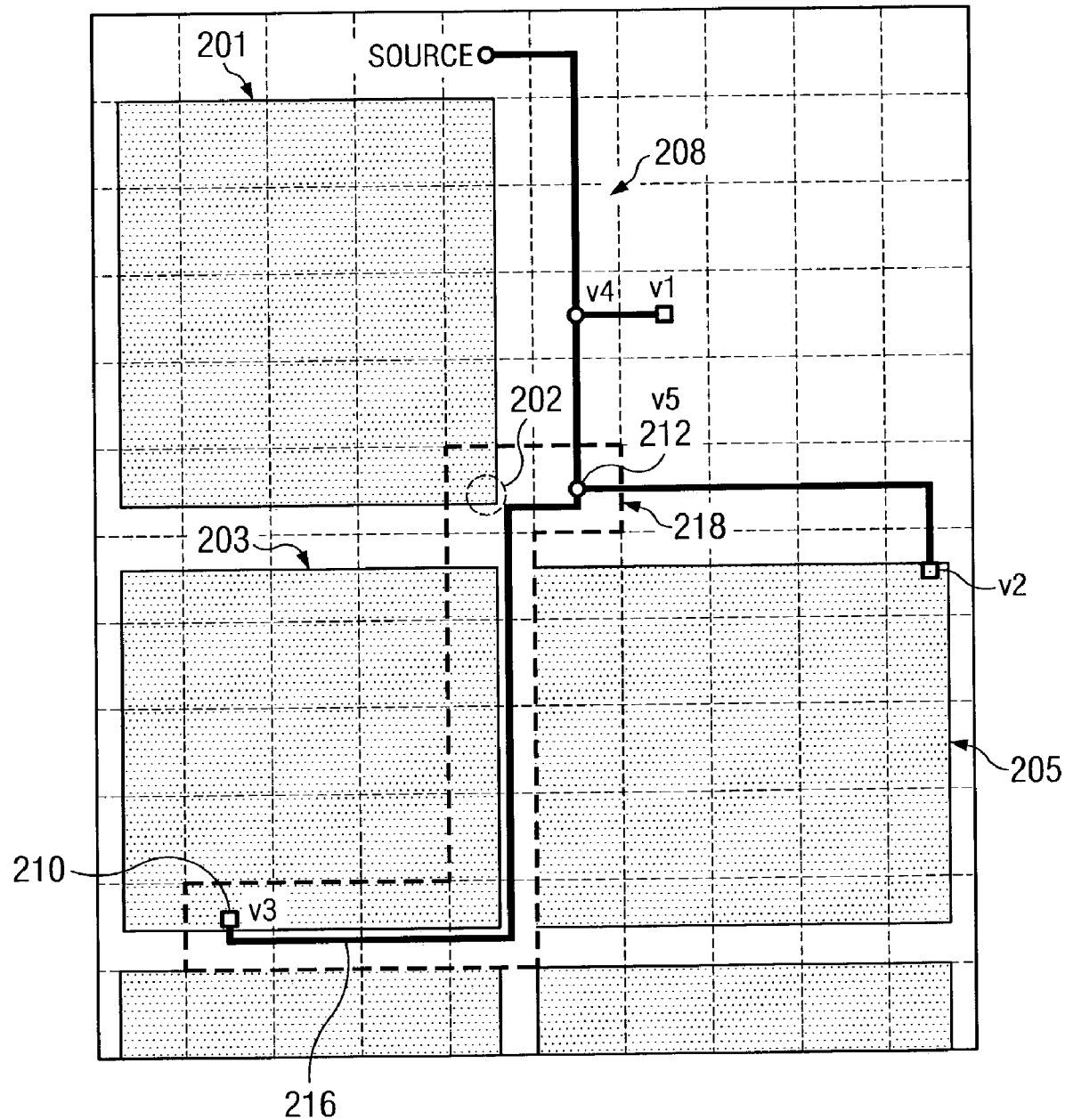

FIG. 2A shows a portion 200 of a Steiner tree before local block avoidance is performed. In a preferred embodiment of the present invention, Steiner tree portion 200 might be the result of executing Stage 2. Shaded rectangles 201, 203, and 205 represent buffer blockages. Subportions 202, 204, and 206 of Steiner tree portion 200 overlap buffer blockages 201 and 203. After applying local buffer blockage avoidance in Stage 3 of a preferred embodiment of the present invention, a resulting Steiner tree portion 208 is obtained, in which overlap of Steiner tree portion 208 and buffer blockages 201 and 203 is avoided.

Finally, in Stage 4, the resulting Steiner tree topology is populated with buffers. A preferred embodiment of the present invention uses van Ginneken's algorithm (described in the aforementioned and incorporated van Ginneken reference) to perform this buffer insertion stage, although any one of a number of existing buffer insertion algorithms may be used without departing from the scope and spirit of the present invention. Since a preferred embodiment of the present invention utilizes known algorithms for Stages 1 and 4, the remainder of this Detailed Description focuses on Stages 2 and 3.

Stage 2: Plate-Based Adjustment

The basic idea behind plate-based adjustment is to perform a simplified simultaneous buffer insertion and local tree adjustment so that the Steiner nodes and wiring paths can be moved to regions with greater porosity without significant disturbance on the timing performance obtained in Stage 1.

The buffer insertion scheme employed here is similar to the length based buffer insertion method described in the aforementioned and incorporated reference, C. J. Alpert, J. Hu, S. S. Sapatnekar, and P. G. Villarrubia, "A practical methodology for early buffer and wire resource," allocation. *Proceedings of the ACM/IEEE Design Automation Conference*, pages 189–194, 2001. However, a preferred embodiment of the present invention also allows the Steiner points and wiring paths to be adjusted. This approach is also distinctive from a simultaneous buffer insertion and Steiner tree construction approach in which the Steiner tree is built from scratch. See J. Lillis, C. K. Cheng, and T. Y. Lin. "Simultaneous routing and buffer insertion for high performance interconnect," *Proceedings of the Great Lake Symposium on VLSI*, pages 148–153, 1996, for an example of a simultaneous buffer insertion and Steiner tree construction approach in which the Steiner tree is built from scratch. The plate-based adjustment of Stage 2 traverses the given Steiner topology in a bottom-up fashion similar to van Ginneken's algorithm. During this process, Steiner nodes and wiring paths may adjusted together with buffer insertion to generate multiple candidate solutions.

Since Stage 2 of a preferred embodiment of the present invention is based in part on van Ginneken's algorithm, an overview van Ginneken's algorithm is provided here in order to form a basis for the remainder of this detailed description of the preferred embodiment. Van Ginneken's algorithm proceeds bottom-up from the leaf nodes along a given tree topology toward the source node. A set of candidate solutions is computed for each node during this process. A candidate solution at a node v is characterized by the load capacitance $c(v)$ seen downstream from v and the required arrival time $q(v)$ at node v. We use a pair $s=(c(v),q(v))$ to specify a buffering solution at v. For any two candidate solutions $s_1=(c_1(v),q_1(v))$ and $s_2=(c_2(v),q_2(v))$, $s_1$ is dominated by (inferior to) $s_2$ if $c_1(v) \geq c_2(v)$ and $q_1(v) \leq q_2(v)$. A candidate solution set $S(v)=\{s_1, s_2, \ldots\}$ is a non-dominating set if no solution in this set is dominated by any other solution in this set. During the bottom-up process of van Ginneken's algorithm, the candidate solutions at each node evolve through the following operations:

Grow(S(v),w): propagate candidate set $S(v)$ from node v to node w to get $S(w)$. If the wire between v and w has resistance of R and capacitance C, we can get $c_i(w)=c_i(v)+C$ and $q_i(w)=q_i(v)-R(C/2+c_i(v))$ for each $(c_i(v),q_i(v))\in S(v)$, and obtain $S(w)$ from the solution pairs $(c_i(w),q_i(w)): \forall i$.

AddBuffer(S(v)): insert buffer at v and add the new candidate into $S(v)$. If a buffer b has an input capacitance $c_b$, output resistance $r_b$ and intrinsic delay $t_b$, we can obtain $c_{i,buf}(v)=c_b$ and $q_{i,buf}=q_i(v)-r_b c_i(v)-t_b$ for each $(c_i(v),q_i(v))\in S(v)$ and add the pair $(c_{i,buf}(v),q_{i,buf}(v))$: $\forall i$ with the maximum $q_{i,buf}$ into $S(v)$.

Merge($S_l(v),S_r(v)$): merge solution set from left child of v to the solution set from the right child of v to obtain a merged solution set $S(v)$. For a solution $(c_{j,left}(v),q_{j,left}(v))$ from the left child and a solution $(c_{k,right}(v),q_{k,right}(v))$ from the right child, the merged solution $(c_i(v),q_i(v))$ is obtained through letting $c_i(v)=c_{j,left}(v)+c_{k,right}(v)$ and $q_i(v)=\min(q_{j,left}(v),q_{k,right}(v))$.

PruneSolutions(S(v)): remove any solution $s_1 \in S(v)$ that is dominated by any other solution $s_2 \in S(v)$.

After a set of candidate solutions are propagated to the source, the solution with the maximum required arrival time is selected for the final solution. For a fixed routing tree, van Ginneken's algorithm can find the optimal solution in $O(n^2)$ time if there are n pins in this net.

C. Alpert and A. Devgan, "Wire Segmenting for Improved Buffer Insertion," Proceedings of the ACM/IEEE Design Automation Conference, pp.588–593, 1997, hereby incorporated by reference, describes an algorithm for segmenting wires to increase the number of buffer insertion points available to a buffer insertion algorithm. If such a wire segmenting technique is used, n should be the number of candidate insertion points.

The range of the moves are restrained by plates, which are defined as follows. For a node $v_i \in T(V,E)$ that is located in a tile $g_k$, a plate $P(v_i)$ for $v_i$ is a set of tiles in a neighborhood of $g_k$, including $g_k$ itself. The term "neighborhood" is used here to denote a set of tiles that is in proximity to a particular tile and that includes that particular tile. One particular neighborhood of $g_k$, for example, might be all tiles within a distance of two tiles from $g_k$, including $g_k$ itself. No particular size requirement for a neighborhood must be followed, however. In general, a neighborhood of a tile is any set of connecting tiles that includes that tile.

During the plate-based adjustment, the location change for each Steiner node is confined within its corresponding plate. If $v_i$ is a sink or the source node, a preferred embodiment lets $P(v_i)=\{g_k\}$. For example, when $v_i$ is a branch node, one particular embodiment sets $P(v_i)$ to be a 3×3 array of tiles centered at $g_k$.

It should be noted that the size of the plate depends on the quality of solution/runtime tradeoff desired by the user. Using a finer tile graph will require a larger plate to push Steiner nodes outside of high density regions. One could alternatively use a 5×5 array or even an alternate shape such as a diamond of tiles all within distance 2 of the original tile, for example. Of course, if $g_k$ lies on the border of the entire tile graph, $P(v_i)$ may include fewer tiles.

Figure 3A:
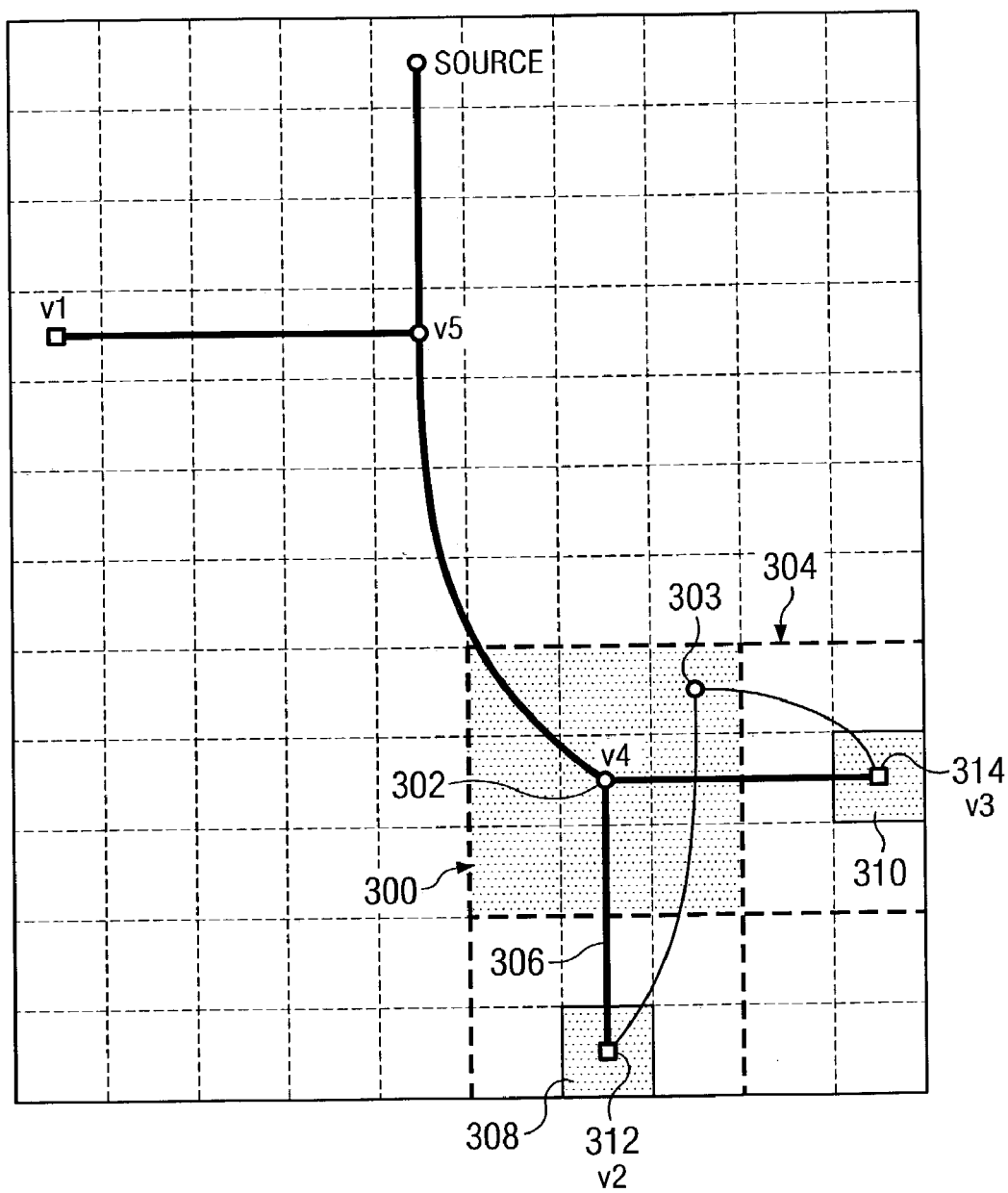
FIGS. 3A–3C are diagrams that depict plate-based adjustments to a Steiner tree topology to avoid dense areas in accordance with a preferred embodiment of the present invention.

FIG. 3A provides an example of a plate 300 corresponding to a Steiner node $v_4$ 302. Plate 300 indicates the range of locations to which Steiner node 302 may be moved in a preferred embodiment of the present invention utilizing a 3×3 plate size. This example shows Steiner node 302 being moved up one tile and right one tile (node 303).

Figure 3B:
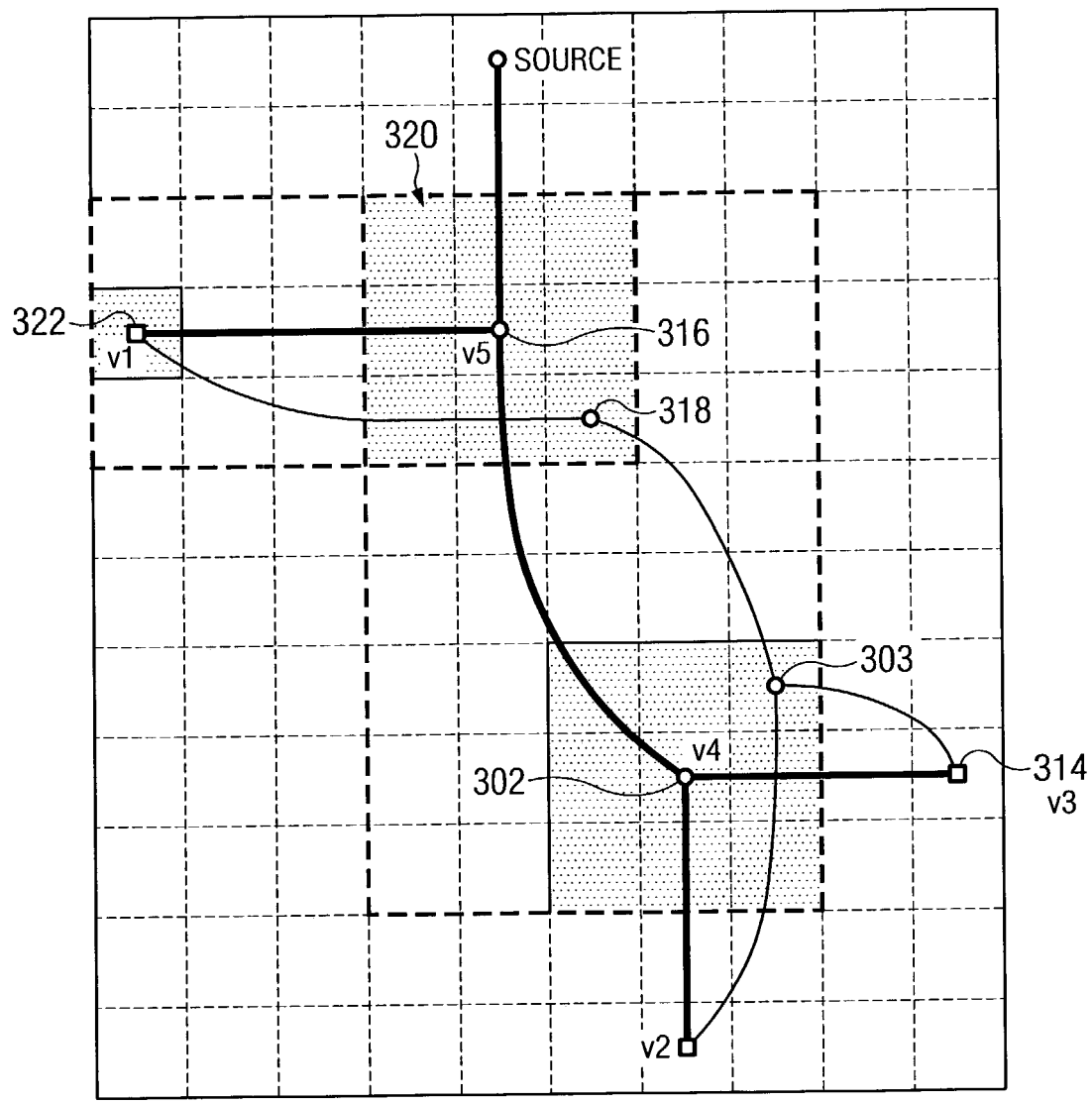

In a preferred embodiment, the search for alternate wiring paths is limited to the minimum bounding box covering the plates of the two end nodes of the original wiring path. In FIG. 3B, such bounding boxes are indicated by thickened dashed lines. Bounding boxes 304 and 306 cover plate 300 of Steiner node $v_4$ 302 and plates 308 and 310 of end points $v_2$ 312 and $v_3$ 314. Therefore, the sizes of the plates define the search range for both Steiner nodes and wiring paths. Certainly, a plate may be defined to include more tiles or to even be a irregular shape. For example, if the plate size is 1×1, the Stage 2 algorithm of this preferred embodiment basically reduces to a length-based/van Ginneken-style buffer insertion algorithm along a fixed topology. However, one could also choose the plate to be the entire tile graph-to do so would then yield an algorithm that is similar to the S-Tree embedding in M. Hrkic and J. Lillis, "S-tree: A technique for buffered routing tree synthesis," *Proceedings of the ACM/IEEE Design Automation Conference*, pages 578–583, 2002. By utilizing a plate size larger than one but smaller than the entire grid graph, a preferred embodiment of the present invention still obtains the ability to modify the topology to move critical Steiner points into low-porosity regions, while also capping the runtime penalty. In a particular preferred embodiment, a 3×3 tile size is utilized in order to balance this tradeoff, although one of ordinary skill in the art will recognize that plates of varying size and shape may be utilized without departing from the scope and spirit of the present invention.

The plate-based adjustment algorithm employed in Stage 2 of a preferred embodiment of the present invention is a dynamic programming algorithm that builds a buffered Steiner tree solution from the bottom (sink nodes) up. An example of how a new Steiner topology might be constructed from an existing topology in accordance with Stage 2 of a preferred embodiment of the present invention is demonstrated in FIGS. 3A–3C. FIG. 3A shows a candidate solution for Steiner point $v_4$ 302 in which Steiner point $v_4$ 302 is moved to point 303, which is within plate 300. FIG. 3B shows a more complete candidate solution obtained by propagating the candidate solution obtained in FIG. 3A to Steiner point $v_5$ 316, which itself is moved to point 318, a point that lies within plate 320. A solution from point $v_1$ 322 is propagated to moved Steiner point $v_5$ 318.

Figure 3C:
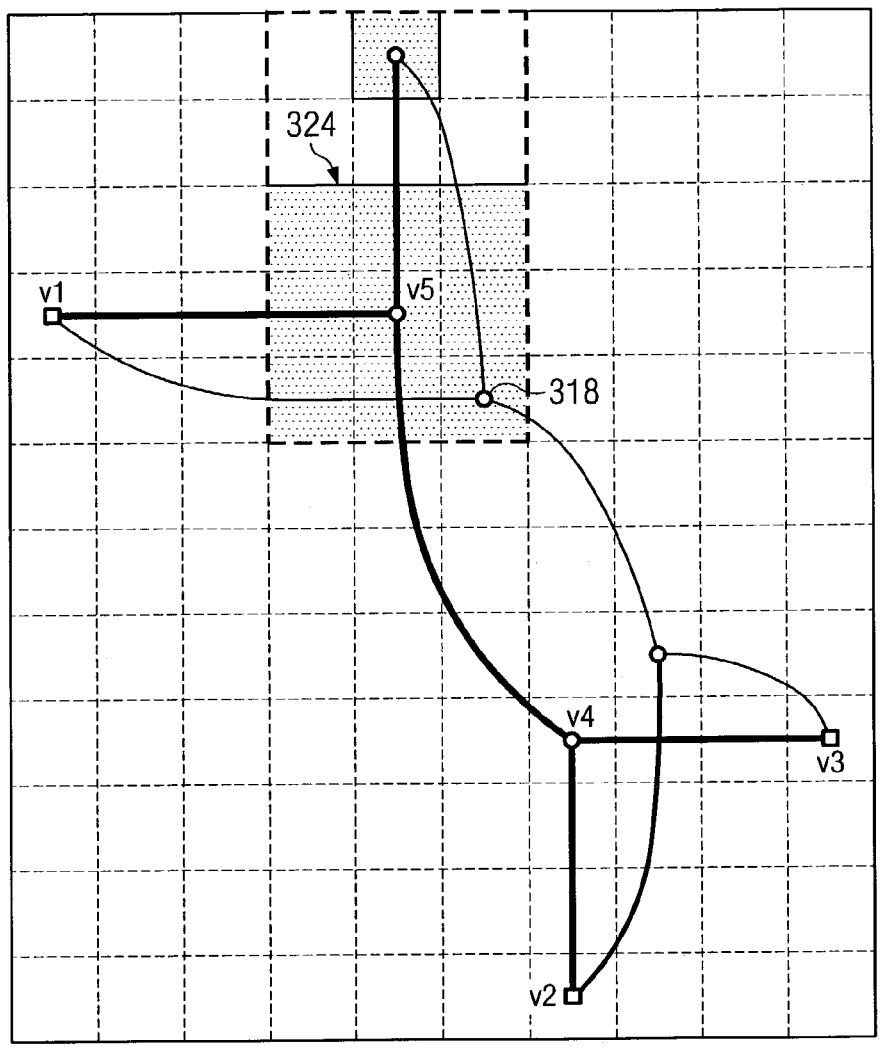

Finally, FIG. 3C shows the candidate solution in FIG. 3B further extended into a more complete candidate solution by propagating the solution at moved Steiner point 318, to further up the Steiner tree, as indicated by wiring path 324. In summary, at each iteration of the Stage 2 algorithm, new candidate solutions are generated by propagating previous solutions to hierarchically higher points in the Steiner tree. Eventually, a set of optimal candidate solutions leading up to the source node (driver) of the original Steiner tree is obtained.

Adopting a length-based buffer insertion scheme, as in C. J. Alpert, C. Hu, S. S. Sapatnekar, and P. G. Villarrubia, "A practical methodology for early buffer and wire resource allocation," *Proceedings of the ACM/IEEE Design Automation Conference*, pages 189–194, 2001, makes the adjustment simpler and thereby faster. Since this stage only produces a Steiner tree before buffering, the purpose of including buffering at this stage is for estimation purposes, hence a simplified scheme should be adequate.

The above-cited Alpert, Hu, Sapatnekar, and Villarrubia paper suggests that buffer insertion may be performed in a simple way by following a rule of thumb: the maximal interval between two neighboring buffers is no greater than a certain upper bound. The interval between neighboring buffers is specified in term of number of tiles. In a preferred embodiment of the present invention, this constraint is modified to be the maximum load capacitance, U, that a buffer/driver may drive, so that sink/buffer capacitance can be incorporated. To keep the succinctness of the tile-based interval metric in the above-cited Alpert, Hu, Sapatnekar, and Villarrubia paper, a preferred embodiment of the present invention discretizes the load capacitance in units equivalent to the capacitance of wire with average tile size. If the average tile boundary length is $\lambda$ and the wire capacitance per unit length is $\hat{c}$, then a load capacitance is expressed in the number of $\beta=\lambda\hat{c}$. This modification allows the use of non-uniform sized tiles, even though we still assume such non-uniformity is very limited. Also, for the sake of simplification, the use of a single "typical" buffer type, the Elmore delay model for interconnect, and a switch level RC gate delay model for this plate-based adjustment are assumed.

Each intermediate buffer solution is characterized by a 3-tuple s(v,c,w) in which v is the root of the subtree, c is the discretized load capacitance seen from v, and w is the accumulated porosity cost. A solution $s_i(v,c_i,w_i)$ is said to be dominated by another solution $s_j(v,c_j,w_j)$, if $c_i \geq c_j$ and $w_i \geq w_j$. A set of buffer solutions S(v) at node v is a non-dominating set when there is no solution in S(v) dominated by another solution in S(v). In a preferred embodiment, S(v) is arranged as an array $\{s_1(v,c_1,w_1), s_2(v,c_2,w_2), \ldots\}$ in ascending order according to the load capacitance. The basic operations of the length-based buffer insertion of Stage 2 of a preferred embodiment of the present invention are:

AddWire($s_i(v,c_i,w_i),u$): grow solution $s_i$ at v to node u by adding a shortest distance wire between them. Node u is either within the same tile as v or in the neighboring tile of v. If the wire has capacitance C, we can get $$c_j(u) = c_i(v) + \frac{C}{\beta}$$

and $w_j(u)=w_i(v)+w(v,u)$ where w(v,u) is the rectilinear distance between v and u, multiplied by the placement density.

AddBuffer($s_i(v,c_i,w_i)$): insert buffer at v. If buffer b has an input capacitance $c_b$, output resistance $r_b$ and intrinsic delay $t_b$, then the buffered solution $s_j(v,c_j,w_j)$ is characterized by $c_j(v)=c_b/\beta$ and $w_j(v)=w_i(v)+p(g)$ in which $p(g)=[d(g)]^2$ is the porosity cost for tile g where node v is located.

Prune(S(v)): remove any solution $s_i \epsilon S(v)$ that is dominated by another solution $s_j \epsilon S(v)$.

Expand($s_i(v,c_i,w_i),u$): grow $s_i(v)$ to node u by AddWire to get solution $s_j(u,c_j,w_j)$, insert buffer for $s_j(u)$ to obtain $s_k(u,c_k,w_k)$. Add the unbuffered solution $s_j$ and buffered solution $s_k$ into solution set S(u) and prune the solutions in S(v).

Merge($S_l(v),S_r(v)$): merge solution set from left child of v to the solution set from the right child of v to obtain a merged solution set S(v). A solution $s_{i,l}(v,c_{i,l},w_{i,l})$ from the left child and a solution $s_{j,r}(v,c_{j,r},w_{j,r})$ are merged to obtain $s_k(v,c_k=c_{i,l}+c_{j,r},w_k=w_{i,l}+w_{j,r})$ only when $c_k \leq U$.

In a similar fashion to van Ginneken's algorithm, starting from the leaf (sink) nodes, candidate solutions are generated and propagated toward the source in a bottom-up manner. Before candidate solutions are propagated from node $v_i$ to its parent node $v_j$, plate $P(v_i)$ and plate $P(v_j)$ are found and a bounding box is defined, where the bounding box is the minimum-size array of tiles covering both $P(v_i)$ and $P(v_j)$. Then all of the candidate solutions from each tile of $P(v_i)$ are propagated to each tile of $P(v_j)$ within this bounding box. Note that branch nodes are allowed to be moved within the neighborhood defined by the node's plate. Since branch nodes are more likely to be buffer sites, due to the demand on decoupling non-critical branch load from the critical path, allowing branch nodes to be moved to less congested area is especially important. Moreover, since such a move forms part of a candidate solution, the move will be committed only when its corresponding candidate solution is finally selected at the driver (i.e., at the root of the Steiner tree). Therefore, such move is dynamically generated and selected according to the request of the final minimum-porosity-cost solution. A complete description of the core algorithm is given in Table I, and a subroutine for solution propagation is provided in Table II.

As can be seen from Table I, the main Stage 2 algorithm is implemented here as a left-recursive function "FindCandidates(v)." In Computer Science, a left-recursive function is a function that initially calls itself to obtain an intermediate result, then uses the intermediate result to complete the computation. One of ordinary skill in the art will appreciate that although the pseudocode representation provided in Table I is implemented as a left-recursive function, the pseudocode representation in Table I may be transformed using well-known techniques into a tail-recursive or iterative procedure. For some examples of such transformation techniques, see L. Sterling and E. Shapiro, *The Art of Prolog*, *2nd Ed.*, MIT Press, 1994, pp. 154–161, which describes a process of using "accumulators" for transforming an arbitrary recursive function into a tail-recursive function in the Prolog programming language (although the process may also be performed in other languages). It well known in the computing art that a tail-recursive function may be mechanically transformed into an iterative function (many compilers do this).

Turning now to the pseudo-code function FindCandidates in Table I, for each node of the Steiner tree having children, FindCandidates first recursively calls itself on the children of that node (lines 2 and 5). When a sink (leaf) node is reached, an initial candidate solution set S(P(v)) containing a single solution {(v,0,0)} is generated and returned as an intermediate result (line 1). Upon the return of an intermediate result from a left child node (or the only child node in the case of a single child), the Propagate subroutine is called with respect to the left/only child node to propagate candidate solutions from the child node's plate to the current node's plate (line 3). Similarly, if a node has two children, the Propagate subroutine is called again with respect to the right child node (line 6), and a Merge operation is performed to join the left and right children's solutions together into a single solution (line 7). Finally, the candidate solutions so obtained are returned (line 4 if only one child, or line 8 if two children).

TABLE I

Procedure: FindCandidates(υ)

| Input: | Current node υ to be processed |
|---|---|
| Output: | Candidate solution set S(P(υ)) |
| Global: | Steiner tree T(V, E) |
|  | Tile graph G($V_G$, $E_G$) |

1. If υ is a sink
   S(υ) ← {(υ, 0, 0)}
   S(P(υ)) ← {S(υ)}
   Return S(P(υ))
2. $υ_l$ ← left child of υ
   S(P($υ_l$)) ← FindCandidates($υ_l$)
3. $S_l$(P(υ)) ← Propagate(S(P($υ_l$)), P(υ))
4. If υ has only one child
   Return $S_l$(P(υ))
5. $υ_r$ ← right child of υ
   S(P($υ_r$)) ← FindCandidates($υ_r$)
6. $S_r$(P(V)) ← Propagate(S(P($υ_r$)), P(υ))
7. S(P(υ)) ← Merge($S_l$(P(υ)), $S_r$(P(υ)))
8. Return S(P(υ))

The Propagate subroutine in Table II handles the propagation of candidate solutions from the plate of a child node, P($v_i$) to the plate of the current node, P($v_j$). Propagate begins by initializing local variables (line 0). S(P($v_j$)), the new candidate solution set to be generated is set to the empty set (Ø). A bounding box B is defined as the minimum bounding box of the two plates. A holding variable Q is initialized to the empty set (ø). For performance purposes, Q may be implemented using a priority queue or heap data structure, such as a Fibonacci Heap, as described in Cormen, Leiserson, Rivest, and Stein, *Introduction to Algorithms, Second Edition*, MIT Press, 2001, pp. 476–497. In Table II, however, On line 1, the candidate solutions for each tile in P($v_i$) are added to Q. While Q is non-empty (line 2), lines 3–5 are executed in a loop. At each iteration of the loop, the minimum cost candidate solution in Q is extracted from Q and placed in variable s, and the tile representing the location of s (i.e., the last tile included in the candidate solution s) is assigned to variable $g_k$.

For each tile $g_l$ that is adjacent to $g_k$ (line 4), line 5 is executed. On line 5, if $g_l$ is within bounding box B, a new candidate solution $s_{new}$ is generated in which a wire is added to the solution in s to extend that solution to $g_l$. A buffered solution $S_{new,buf}$ is generated from $s_{new}$, in which a buffer is inserted at tile $g_l$. These new solutions ($s_{new}$ and $S_{new,buf}$) are added to the candidate solution set for $g_l$ (denoted S($g_l$)) and to Q. Inferior candidate solutions in S($g_l$) are then pruned from S($g_l$), and these pruned solutions are also removed from Q. Finally, on line 6, the candidate solution set S(P($v_j$)) is returned. (Note that by the time line 6 in Table II is executed, since all tiles in P($v_j$) will have been given candidate solutions on line 5, S(P($v_j$)) will contain the appropriate solutions.).

TABLE II

Procedure: Propagate(S(P($υ_i$)), P($υ_j$))

| Input: | Candidate solutions at P($υ_i$) |
|---|---|
|  | Expansion region P($υ_j$) |
| Output: | Candidate solution set S(P($υ_j$)) |

0. S(P($υ_j$)) ← ∅
   B ← bounding box of P($υ_i$) and P($υ_j$)
   Q ← ∅
1. For each tile $g_k$ ∈ P($υ_i$)
   Q ← Q ∪ S($g_k$)
2. While Q ≠ ∅
3.    s ← extract min cost solution in Q
      $g_k$ ← tile where s locates
4.    For each tile $g_l$ adjacent to $g_k$
5.      If $g_l$ ∈ B
        $s_{new}$($g_l$) ← AddWire(s($g_k$),$g_l$)
        $s_{new,buf}$($g_l$) ← AddBuffer($s_{new}$($g_l$))
        S($g_l$) ← S($g_l$) ∪ $s_{new}$($g_l$) ∪ $s_{new,buf}$($g_l$)
        Q ← Q ∪ $s_{new}$($g_l$) ∪ $s_{new,buf}$($g_l$)
        Prune(S($g_l$))
        Remove pruned solutions from Q
6. Return S(P($υ_j$))

Stage 3: Local Blockage Avoidance

After the initial (Stage 1) tree has been modified to route through the tiles with high porosity (Stage 2), the resulting tree still may overlap blockages. This is especially true if a sparse grid graph is used to begin with. This overlapping occurs because the plate-based adjustment in Stage 2 is performed with respect to a given tile graph, but large blockages themselves are managed as part of a tile. For example, if a blockage occupies half of the area of a given tile, but the remaining half of the tile is empty, the tile's density is 50%. Of course, a net that traverses through this tile should be routed in the space not occupied by the blockage wherever possible. Thus, Stage 3 performs local cleanup within tiles to achieve blockage avoidance without changing tile assignment.

The local blockage avoidance is similar to the algorithm proposed in the aforementioned and incorporated C. J. Alpert, G. Gandham, J. Hu, J. L. Neves, S. T. Quay, and S. S. Sapatnekar, "A Steiner tree construction for buffers, blockages, and bays," *IEEE Transactions on Computer-Aided Design*, 20(4): 556–562, April 2001. The main idea is to divide each Steiner tree into a set of non-overlapping 2-paths and then perform local blockage avoidance on each 2-path. A 2-path is a path of nodes for a given Steiner tree such that both endpoints are either the source, a sink, or a Steiner node. Thus, every internal node has degree two.

Figure 4A:
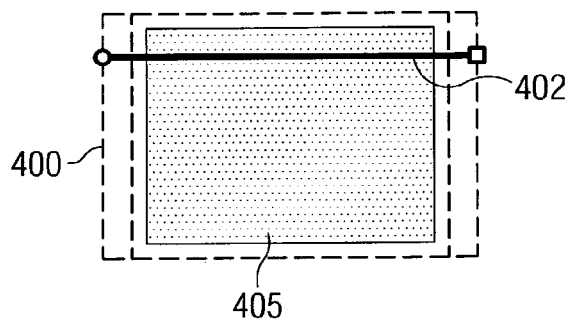

Each 2-path of a given Steiner tree is rerouted over an extended Hanan grid generated by drawing horizontal and vertical lines through each end-point of the 2-path and extending the borders of each rectangle shaped buffer blockage. An extended Hanan grid for a 2-path 402 is shown by the dashed lines in FIG. 4A. If an edge of a grid (e.g., grid 400 in FIG. 4A) does not overlap with any blockage, its cost is its geometric length. Otherwise, the edge cost will be the geometric length of the edge, multiplied by a penalty coefficient greater than one. A minimum-cost path is searched over this grid to replace original 2-path to achieve blockage avoidance. The value of the penalty coefficient controls the tradeoff between blockage avoidance and total wirelength. A suitable existing "shortest path" algorithm, such as the well-known Dijkstra's Algorithm in Cormen, Leiserson, Rivest, and Stein, *Introduction to Algorithms, Second Edition*, MIT Press, 2001, pp. 595–601, which is hereby incorporated by reference, may be used to calculate this path, although any of a number of such algorithms as may exist in the art may be used without limitation and without departing from the scope and spirit of the present invention.

Figure 4B:
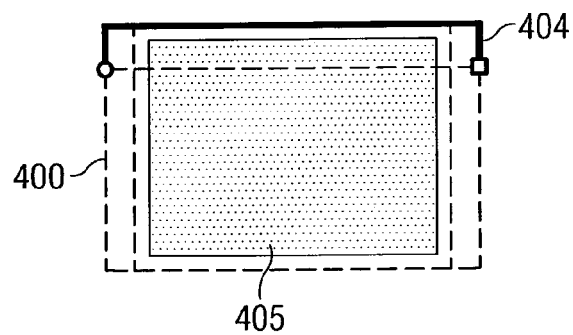

A greater value of penalty coefficient implies a stronger desire to avoid a blockage and allows for a greater wiring detour. A small penalty coefficient will restrict the total wirelength and reduce blockage avoidance ability. This tradeoff is illustrated in FIGS. 4A–4D. FIG. 4B demonstrates a wiring detour 404 of 2-path 402 in FIG. 4A around a blockage 405, exemplifying a detour that is allowed by the use of a comparatively small penalty coefficient. Similarly, FIG. 4D demonstrates a wiring detour 408 of a 2-path 406 in FIG. 4C around the same blockage 405, exemplifying a detour that is allowed by the use of a comparatively large penalty coefficient.

To compare the blockage avoidance method employed in a preferred embodiment of the present invention with that of the aforementioned Alpert, Gandham, Hu, Neves, Quay, and Sapatnekar reference, in the reference the entire region covering the two endpoints is properly expanded and searched. For example, in FIG. 2A, when the 2-path between point $v_3$ 210 and point $v_5$ 212 is rerouted, the search region is as indicated by thickened dashed lines 214. In a preferred embodiment of the present invention, however, since the Steiner tree after stage 2 is already routed through high porosity regions, the search region may be refined to be the tiles the 2-path passes through, as shown by thickened dashed lines 218 in FIG. 2B. In a preferred embodiment, the penalty coefficient is defined to be 1.01, so that the wire detour from rerouting will be very small (no more than 1% wirelength increase) and the disturbance to the timing performance of the tree is very limited. FIG. 2B shows rerouted path 216 after Stage 3 blockage avoidance is performed.

With reference now to the figures and in particular with reference to FIG. 5, a pictorial representation of a data processing system in which the present invention may be implemented is depicted in accordance with a preferred embodiment of the present invention. A computer 500 is depicted which includes system unit 502, video display terminal 504, keyboard 506, storage devices 508, which may include floppy drives and other types of permanent and removable storage media, and mouse 510. Additional input devices may be included with personal computer 500, such as, for example, a joystick, touchpad, touch screen, trackball, microphone, and the like. Computer 500 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 500 also preferably includes a graphical user interface (GUI) that may be implemented by means of systems software residing in computer readable media in operation within computer 500.

With reference now to FIG. 6, a block diagram of a data processing system is shown in which the present invention may be implemented. Data processing system 600 is an example of a computer, such as computer 500 in FIG. 5, in which code or instructions implementing the processes of the present invention may be located. Data processing system 600 employs a peripheral component interconnect (PCI) local bus architecture. Although the depicted example employs a PCI bus, other bus architectures such as Accelerated Graphics Port (AGP) and Industry Standard Architecture (ISA) may be used. Processor 602 and main memory 604 are connected to PCI local bus 606 through PCI bridge 608. PCI bridge 608 also may include an integrated memory controller and cache memory for processor 602. Additional connections to PCI local bus 606 may be made through direct component interconnection or through add-in boards. In the depicted example, local area network (LAN) adapter 610, small computer system interface SCSI host bus adapter 612, and expansion bus interface 614 are connected to PCI local bus 606 by direct component connection. In contrast, audio adapter 616, graphics adapter 618, and audio/video adapter 619 are connected to PCI local bus 606 by add-in boards inserted into expansion slots. Expansion bus interface 614 provides a connection for a keyboard and mouse adapter 620, modem 622, and additional memory 624. SCSI host bus adapter 612 provides a connection for hard disk drive 626, tape drive 628, and CD-ROM drive 630. Typical PCI local bus implementations will support three or four PCI expansion slots or add-in connectors.

An operating system runs on processor 602 and is used to coordinate and provide control of various components within data processing system 600 in FIG. 6. The operating system may be a commercially available operating system such as Windows XP, which is available from Microsoft Corporation. An object oriented programming system such as Java may run in conjunction with the operating system and provides calls to the operating system from Java programs or applications executing on data processing system 600. "Java" is a trademark of Sun Microsystems, Inc. Instructions for the operating system, the object-oriented programming system, and applications or programs are located on storage devices, such as hard disk drive 626, and may be loaded into main memory 604 for execution by processor 602.

Those of ordinary skill in the art will appreciate that the hardware in FIG. 6 may vary depending on the implementation. Other internal hardware or peripheral devices, such as flash read-only memory (ROM), equivalent nonvolatile memory, or optical disk drives and the like, may be used in addition to or in place of the hardware depicted in FIG. 6. Also, the processes of the present invention may be applied to a multiprocessor data processing system.

For example, data processing system 600, if optionally configured as a network computer, may not include SCSI host bus adapter 612, hard disk drive 626, tape drive 628, and CD-ROM 630. In that case, the computer, to be properly called a client computer, includes some type of network communication interface, such as LAN adapter 610, modem 622, or the like. As another example, data processing system 600 may be a stand-alone system configured to be bootable without relying on some type of network communication interface, whether or not data processing system 600 comprises some type of network communication interface. As a further example, data processing system 600 may be a personal digital assistant (PDA), which is configured with ROM and/or flash ROM to provide non-volatile memory for storing operating system files and/or user-generated data.

The depicted example in FIG. 6 and above-described examples are not meant to imply architectural limitations. For example, data processing system 600 also may be a notebook computer or hand held computer in addition to taking the form of a PDA. Data processing system 600 also may be a kiosk or a Web appliance.

The processes of the present invention are performed by processor 602 using computer implemented instructions, which may be located in a memory such as, for example, main memory 604, memory 624, or in one or more peripheral devices 626–630.

It is important to note that while the present invention has been described in the context of a fully functioning data processing system, those of ordinary skill in the art will appreciate that the processes of the present invention are capable of being distributed in the form of a computer readable medium of instructions or other functional descriptive material and in a variety of other forms and that the present invention is equally applicable regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system. Functional descriptive material is information that imparts functionality to a machine. Functional descriptive material includes, but is not limited to, computer programs, instructions, rules, facts, definitions of computable functions, objects, and data structures.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method comprising:
    generating an initial Steiner tree connecting a source node to at least one sink node in an integrated circuit layout, wherein the initial Steiner tree is generated according to heuristics that do not take into account density of regions in the integrated circuit layout;
    adjusting a topology of the initial Steiner tree so as to avoid dense regions in the integrated circuit layout, thus obtaining a porosity-aware Steiner tree; and
    inserting buffers into the porosity-aware Steiner tree;
    wherein adjusting the initial Steiner tree includes:
        determining a first plate, wherein the first plate includes a plurality of tiles in a neighborhood of a first node in the initial Steiner tree;
        determining a second plate, wherein the second plate includes a plurality of tiles in a neighborhood of a second node in the initial Steiner tree, wherein the second node is connected to the first node via a wiring path in the initial Steiner tree;
        generating node candidate solutions for adjustment of the first node by enumerating locations within the first plate;
        generating wiring path candidate solutions for adjustment of the wiring path by forming alternative paths from the candidate solutions for adjustment of the first node;
        calculating a cost function associated with each of the wiring path candidate solutions; and
        choosing a new location for to first node and a new wiring path by choosing a minimum-cost candidate solution from the wiring path candidate solutions.

2. The method of claim 1, further comprising:
    determining a bounding shape, wherein the bounding shape is a minimum bounding shape of the first plate and the second plate, wherein the alternative paths are confined to the bounding shape.

3. The method of claim 2, wherein the bounding shape is a bounding box.

4. A computer program product in at least one computer-readable medium, comprising functional descriptive material that, when executed by a computer, enables the computer to perform acts including:
    generating an initial Steiner tree connecting a source node to at least one sink node in an integrated circuit layout, wherein the initial Steiner tree is generated according to heuristics that do not take into account density of regions in the integrated circuit layout;
    adjusting a topology of the initial Steiner tree so as to avoid dense regions in the integrated circuit layout, thus obtaining a porosity-aware Steiner tree; and
    inserting buffers into the porosity-aware Steiner tree;
    wherein adjusting the initial Steiner tree includes:
        determining a first plate, wherein the first plate includes a plurality of tiles in a neighborhood of a first node in the initial Steiner tree;
        determining a second plate, wherein the second plate includes a plurality of tiles in a neighborhood of a second node in the initial Steiner tree, wherein the second node is connected to the first node via a wiring path in the initial Steiner tree;
        generating node candidate solutions for adjustment of the first node by enumerating locations within the first plate;
        generating wiring path candidate solutions for adjustment of the wiring path by forming alternative paths from the candidate solutions for adjustment of the first node;
        calculating a cost function associated with each of the wiring path candidate solutions; and
        choosing a new location for the first node and a new wiring path by choosing a minimum-cost candidate solution from the wiring path candidate solutions.

5. The computer program product of claim 4, comprising additional functional descriptive material that, when executed by the computer, causes the computer to perform additional acts including:

determining a bounding shape, wherein the bounding shape is a minimum bounding shape of the first plate and the second plate, wherein the alternative paths are confined to the bounding shape.

6. The computer program product of claim 5, wherein the bounding shape is a bounding box.

7. A data processing system comprising:

means for generating an initial Steiner tree connecting a source node to at least one sink node in an integrated circuit layout, wherein the initial Steiner tree is generated according to heuristics that do not take into account density of regions in the integrated circuit layout;

means for adjusting a topology of the initial Steiner tree so as to avoid dense regions in the integrated circuit layout, thus obtaining a porosity-aware Steiner tree; and means for inserting buffers into the porosity-aware Steiner tree;

wherein adjusting the initial Steiner tree includes:

means for determining a first plate, wherein the first plate includes a plurality of tiles in a neighborhood of a first node in the initial Steiner tree;

means for determining a second plate, wherein the second plate includes a plurality of tiles in a neighborhood of a second node in the initial Steiner tree, wherein the second node is connected to the first node via a wiring path in the initial Steiner tree;

means for generating node candidate solutions for adjustment of the first node by enumerating locations within the first plate;

means for generating wiring path candidate solutions for adjustment of the wiring path by forming alternative paths from the candidate solutions for adjustment of the first node;

means for calculating a cost function associated with each of the wiring path candidate solutions; and means for choosing a new location for the first node and a new wiring path by choosing a minimum-cost candidate solution from the wiring path candidate solution.

8. The data processing system of claim 7, further comprising: means for determining a bounding shape, wherein the bounding shape is a minimum bounding shape of the first plate and the second plate, wherein the alternative paths are confined to the bounding shape.

* * * * *